April 29, 1958 P. R. CAMP 2,832,898

TIME DELAY TRANSISTOR TRIGGER CIRCUIT

Filed July 12, 1954

INVENTOR.
PAUL R. CAMP
BY J. L. Whittaker
ATTORNEY

United States Patent Office 2,832,898
Patented Apr. 29, 1958

2,832,898

TIME DELAY TRANSISTOR TRIGGER CIRCUIT

Paul R. Camp, Middletown, Conn., assignor to Radio Corporation of America, a corporation of Delaware Application July 12, 1954, Serial No. 442,790

6 Claims. (Cl. 307—88.5)

This invention relates to semiconductor devices and systems and particularly to switch-type semiconductor devices and systems.

Many types of switching or triggering circuits are well known in the electronic arts. Electron tubes such as thyratrons and tubes operating with negative resistance characteristics are also used for performing these functions. Semiconductor materials and semiconductor devices have many favorable characteristics especially advantageous for accomplishing many of the aforementioned functions previously effected by electron tubes.

Accordingly, an important object of this invention is to provide a semiconductor device and system of new and improved form.

A further object of this invention is to provide an improved semiconductor device suitable for switching or triggering operations.

Another object of this invention is to provide an improved negative resistance semiconductor device and system.

A further object of this invention is to provide a semiconductor device and system having some characteristics of thyratron-type systems and devices.

In general, the purposes and objects of this invention are accomplished by a body or crystal of semiconductor material having ohmic (non-rectifying) contact electrodes at opposite ends thereof. A battery is connected between said ohmic electrodes to establish a characteristic voltage distribution and electric field along the length of said body. A plurality of rectifying electrodes in contact with the body intermediate said ohmic electrodes are initially electrically biased in the reverse direction with respect to the portions of the semiconductor body in the vicinity of the electrodes. When one of the rectifying electrodes becomes electrically biased in the forward direction with respect to the crystal, for example, by the application of a signal voltage either to the rectifying electrode or across the crystal, the electrode thus energized acts as an emitter and injects minority charge carriers into the crystal. The minority charge carriers are swept along the body by the electric field transverse thereto, and reduce the resistivity of the body whereby the others of the rectifying electrodes successively become electrically forwardly biased in order and thus are switched into the current injecting state. Separate load circuits may be connected to each of said other rectifying electrodes.

Figure 1:
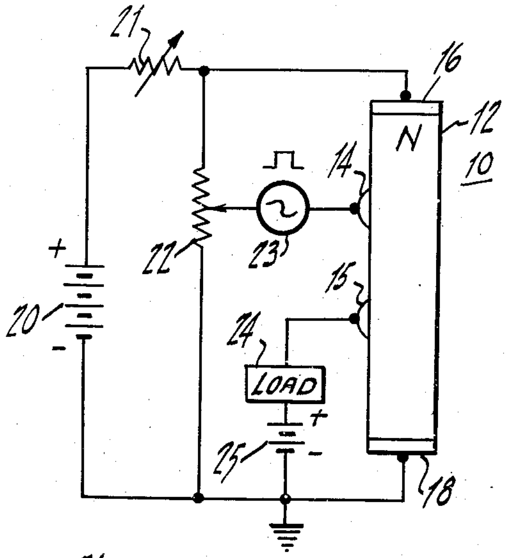
Figure 2:
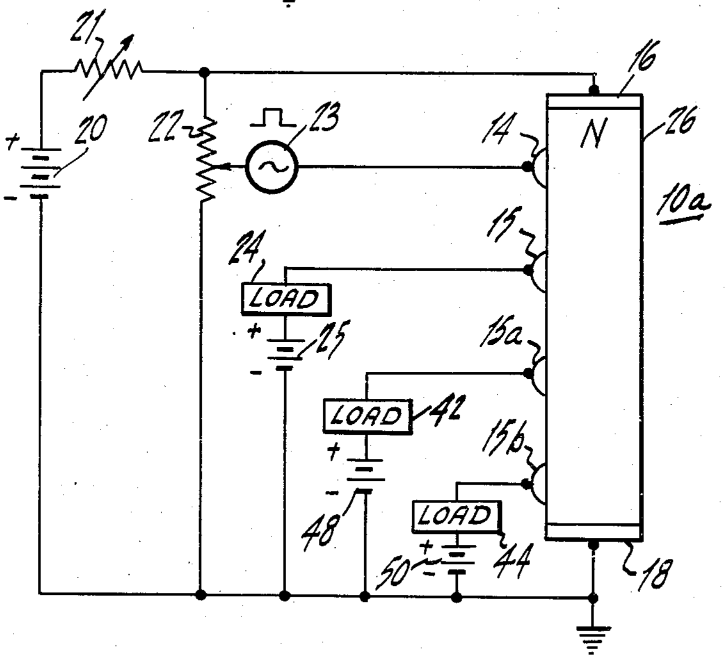

The invention is described in greater detail by reference to the drawings wherein:

Fig. 1 is an elevational view of a device embodying the principles of the invention and a schematic representation of a circuit in which it may be operated; and, Fig. 2 is an elevational view of a modification of the device of Fig. 1 and a schematic representation of a circuit in which it may be operated.

Similar elements are designated by similar reference characters throughout the drawings.

Referring to Figure 1, a semiconductor device 10 embodying the principles of the invention, comprises a body 12 of semiconductor material, for example germanium or silicon or the like, of N-type or P-type conductivity. The semiconductor body will be assumed, in the following description, to be N-type germanium, and may be in the form of a cylindrical rod, filament, plate or the like. A pair of rectifying electrodes 14 and 15 are in contact with the body 12. The electrodes 14 and 15 may be comparatively large-area electrodes such as surface barrier plates or film or P–N junction electrodes. If desired, in the circuit shown, electrode 14, may be a small-area electrode such as a whisker or point contact.

The rectifying electrodes 14 and 15 are preferably P–N junction electrodes and may be formed by an alloying or fusion process disclosed and claimed by Charles W. Mueller in a co-pending U. S. Patent application, Serial Number 295,304, filed June 24, 1952, and assigned to the assignee of this application. According to the method described in the said Mueller application, disks or pellets of a so-called impurity material imparting P-type conductivity, are placed in contact with selected portions of the surface of the block 12 of N-type germanium. The assembly of block and pellets is heated in an atmosphere of hydrogen, or an inert gas such as argon. The heating is effected at a temperature sufficient to cause the pellets to melt and alloy with the germanium block to form, on cooling, the P–N junctions.

With a body of N-type germanium, the impurity material may comprise one or more acceptor substances such as indium, aluminum, gallium, boron or zinc. If the semiconductor body is of P-type germanium, the impurity material may comprise one or more donor substances imparting N-type conductivity such as arsenic, bismuth, antimony, sulfur, selenium, tellurium or phosphorus.

After the P–N junction electrodes 14 and 15 have been formed in the semiconductor body 12, a pair of electrodes 16 and 18 are bonded to the body in low resistance or ohmic (non-rectifying) contact, with the electrodes positioned substantially at opposite ends of the body. The electrodes may be in the form of plates, tabs, electroplated areas, disks or the like and are adapted not to inject minority charge carriers into the body.

The device 10 shown in Figure 1, may be operated in a circuit to provide a thyratron-type of operation. In such a circuit, the positive terminal of a battery 20 is connected through a variable resistor 21 to the ohmic electrode 16 and the negative terminal of the battery is connected to the ohmic electrode 18. A voltage distribution along the length of the crystal 12 is thus established and controlled by the resistor 21. For convenience, the ohmic electrode 18 is connected to a source of reference potential, such as ground. A potentiometer 22 is also connected between the ohmic contact electrodes 16 and 18 and across the combination of the battery 20 and variable resistor 21.

A signal source 23 is connected between the P–N junction electrode 14 and the sliding contact on the potentiometer 22. The sliding contact is adjusted so that, in the absence of a signal from the source 23, the junction electrode 14 is biased in the reverse direction with respect to the body 12 and thus normally does not inject minority charge carriers. The P–N junction electrode 15 is connected through a suitable load 24 to the positive terminal of a battery 25, the negative terminal of which is connected to ground. The battery 25 is of such a magnitude that the electrode 15 is also biased in the reverse direction with respect to the body 12 so that it does not inject minority charge carriers into the body.

The expression for the voltage $V_x$ of any point of the body 12 with respect to the electrode 18 is $$V_x = \frac{x}{L} V_{16}$$

where $x$ is the distance between electrode 18 and the point $x$; L is the length of the body 12; and $V_{16}$ is the voltage at the electrode 16. The necessary bias voltage for the rectifying electrodes 14 and 15 may be determined from this expression.

Initially, there is a flow of electrons through the crystal 12 between the electrodes 16 and 18 due to the battery 20. However, only a very small current, the saturation current, flows through the P–N junction electrodes 14 and 15. To cause charge injection from these rectifying electrodes into the body, the voltage distribution along the body between the ohmic electrodes 16 and 18 must be changed so that the junction electrodes 14 and 15 become slightly positive with respect to the portions of the body adjacent thereto.

This voltage unbalance is achieved in two steps. First, a signal, for example a positive pulse, from the source 23 is applied to the electrode 14. If this signal is of sufficient amplitude, the electrode 14 becomes positive with respect to the portion of the body 12 adjacent thereto and minority charge carriers, in this case holes, are injected into the crystal by the electrode 14. These charge carriers are swept along the body 12 toward the negative electrode 18 and reduce the resistivity of this portion of the body. This change in the resistivity of the body changes the distribution of voltage thereacross and the electrode 15 becomes biased in the forward direction with respect to the body. Thus, the electrode 15 injects minority charge carriers into the body. A current then flows through the external circuit connected to the electrode 15 and an output signal is applied to the load 24. From the foregoing description, it is clear that the electrode 15 is positioned between the electrode 14 and the ohmic electrode 18 to which the minority charge carriers are attracted.

Referring to Figure 2, if desired a device **10*a* having more than two sequentially switched electrodes may be provided. In this construction, an N-type germanium crystal 26 is provided with the ohmic contact electrodes 16 and 18 at its ends and, for example, four rectifying electrodes 14, 15, 15*a* and 15*b* spaced apart along the length thereof. The battery 20 and variable resistor 21 are connected between electrodes 16 and 18 and the potentiometer 22 is similarly connected. The electrode 14 is connected to the signal source 23 and to the sliding contact of the potentiometer 22 whereby it is initially biased in the reverse or non-conducting direction. The electrode 15 is connected to the load 24 and to bias battery 25 and, similarly, the electrodes 15*a* and 15*b* are connected to loads 42 and 44, respectively, and to bias batteries 48 and 50**, respectively, whereby each of these electrodes is also initially biased in the reverse or non-conducting direction.

When a pulse from the source 23 is applied to the electrode 14, this electrode injects minority charge carriers into the body 26 and, in the manner described above, each of the electrodes 15, **15*a* and 15*b* successively is biased, in turn, into the conducting state whereby separate output signals appear in each of the load circuits 24, 42 and 44. In this embodiment of the invention, too, the circuit operation requires that the electrodes 15, 15*a* and 15*b* are positioned between the electrode 14 and the electrode 18** to which the minority charge carriers are drawn.

What is claimed is:

1. A semiconductor triggering system comprising a body of semi-conductor material, means in contact with said body for applying a voltage across said body, first and second rectifying electrodes in contact with said body, means for applying bias voltages to said rectifying electrodes such that said rectifying electrodes are biased in the reverse direction with respect to adjacent portions of said body whereby said electrodes normally do not inject minority charge carriers into said body, and means for varying the potential of said first rectifying electrode with respect to said adjacent portion of said body such that minority charge carriers flow therefrom into said body, said second rectifying electrode being thereby triggered into injecting minority charge carriers into said body.

2. A semiconductor triggering system comprising a body of semiconductor material, a pair of ohmic contact electrodes in contact with said body and adapted for applying a voltage across said body between said electrodes, first and second rectifying electrodes in operative relation with said body and unequally distant from at least one of said pair, means for applying bias voltages to said rectifying electrodes such that said rectifying electrodes are biased in the reverse direction with respect to adjacent portions of said body whereby said electrodes normally do not inject minority charge carriers into said body, and means for varying the electrical potential of said first rectifying electrode with respect to said adjacent portion of said body and thereby causing injection of minority carriers therefrom into said body, said second rectifying electrode being thereby triggered to inject minority charge carriers into said body.

3. A semiconductor triggering system comprising a body of semiconductor material, a pair of ohmic contact electrodes in contact with said body and adapted for applying a voltage across said body between said electrodes, a plurality of rectifying electrodes in contact with said body and unequally distant from at least one of said pair, each of said electrodes being biased in the reverse direction with respect to adjacent portions of said body whereby said electrodes normally do not inject minority charge carriers into said body, and means for varying the electrical potential of one of said rectifying electrodes with respect to said adjacent portion of said body and thereby causing injection of minority carriers therefrom into said body, said injected carriers triggering the other of said rectifying electrodes to inject minority charge carriers into said body.

4. A semiconductor triggering system comprising a body of semiconductor material of N-type conductivity, a pair of ohmic contact electrodes in contact with said body and adapted for applying a voltage across said body between said electrodes, a plurality of rectifying electrodes in contact with said body and forming PN junctions therein, each of said electrodes being spaced unequally distant from at least one of said pair and biased in the reverse direction with respect to adjacent portions of said body whereby said electrodes normally do not inject minority charge carriers into said body, and means for varying the electrical potential of one of said rectifying electrodes with respect to said adjacent portion of said body and thereby causing injection of minority carriers therefrom into said body, said injected carriers triggering in sequence the other of said rectifying electrodes to inject minority charge carriers into said body.

5. A semiconductor triggering system comprising a body of semiconductor material, a pair of ohmic contact electrodes in contact with said body and adapted for applying a voltage across said body between said electrodes, first and second rectifying electrodes in operative relation with said body, said electrodes being spaced unequally distant from at least one of said pair, means for applying bias voltages to said rectifying electrodes such that said rectifying electrodes are biased in the reverse direction with respect to adjacent portions of said body whereby said electrodes normally do not inject minority charge carriers into said body, and a signal source for varying the electrical potential of said first rectifying electrode with respect to said adjacent portion of said body thereby to cause injection of minority carriers therefrom into said body, said second rectifying electrode being thereby triggered to inject minority charge carriers into said body.

6. A semiconductor triggering system comprising a body of semiconductor material, a pair of ohmic contact electrodes in contact with said body and adapted for applying a voltage across said body between said electrodes, first and second rectifying electrodes in operative relation with said body, said electrodes being spaced unequally distant from at least one of said pair, means for applying bias voltages to said rectifying electrodes such that said rectifying electrodes are biased in the reverse direction with respect to adjacent portions of said body whereby said electrodes normally do not inject minority charge carriers into said body, a signal source for varying the electrical potential of said first rectifying electrode with respect to said adjacent portion of said body thereby to cause injection of minority carriers therefrom into said body, said second rectifying electrode being thereby triggered to inject minority charge carriers into said body, and a load device connected to said second rectifying electrode.

References Cited in the file of this patent

UNITED STATES PATENTS

| | | |
|---|---|---|
| 2,553,490 | Wallace | May 15, 1951 |
| 2,597,028 | Pfann | May 20, 1952 |
| 2,600,500 | Haynes et al. | June 17, 1952 |
| 2,736,822 | Dunlap | Feb. 28, 1956 |
| 2,761,020 | Shockley | Aug. 28, 1956 |

FOREIGN PATENTS

| | | |
|---|---|---|
| 1,077,185 | France | Apr. 28, 1954 |